United States Patent
Ukegawa et al.

(10) Patent No.: US 9,653,999 B2
(45) Date of Patent: May 16, 2017

(54) POWER SUPPLY APPARATUS

(71) Applicants: Hiroshi Ukegawa, Toyota (JP); Yukio Onishi, Nagoya (JP)

(72) Inventors: Hiroshi Ukegawa, Toyota (JP); Yukio Onishi, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 14/895,156

(22) PCT Filed: Jun. 24, 2013

(86) PCT No.: PCT/JP2013/067292
§ 371 (c)(1),
(2) Date: Dec. 1, 2015

(87) PCT Pub. No.: WO2014/207812
PCT Pub. Date: Dec. 31, 2014

(65) Prior Publication Data
US 2016/0105112 A1    Apr. 14, 2016

(51) Int. Cl.
*B60K 28/14*    (2006.01)
*H02M 3/158*    (2006.01)
(Continued)

(52) U.S. Cl.
CPC .......... *H02M 3/158* (2013.01); *H02H 7/1213* (2013.01); *B60L 2210/00* (2013.01); *H02M 2001/325* (2013.01)

(58) Field of Classification Search
CPC . B60L 11/1803; B60L 15/007; H02M 7/4826; H02M 7/493; H02M 7/53873; H02P 27/04
(Continued)

(56) References Cited

U.S. PATENT DOCUMENTS 5,796,175 A * 8/1998 Itoh .................. B60L 3/0023
307/10.1
5,818,122 A * 10/1998 Miyazawa ............ B60K 28/14
180/282
(Continued)

FOREIGN PATENT DOCUMENTS

DE    10 2009 045 244 A1    4/2011
EP         2 463 995 A2    6/2012
(Continued)

*Primary Examiner* — Rajnikant Patel
(74) *Attorney, Agent, or Firm* — Oliff PLC

(57) ABSTRACT

A power supply apparatus is provided which includes a power supply; a DC/DC converter including a switching element of an upper arm, a switching element of a lower arm and a reactor; a first switch provided between the switching element of the lower arm and the negative electrode of the power supply, the first switch being normally closed; a power supply fuse provided between the positive electrode of the power supply and the other end of the reactor; a second power supply fuse connected to the power supply fuse in parallel; a second switch connected to the second power supply fuse in series and connected to the power supply in parallel, the second switch being normally opened; and a controller that opens the first switch and closes the second switch upon a short circuit failure of the switching element of the lower arm being detected.

9 Claims, 11 Drawing Sheets

(51) Int. Cl.
*H02H 7/12* (2006.01)
*H02M 1/32* (2007.01)

(58) Field of Classification Search
USPC ......... 318/139, 434, 376, 801; 307/91, 10.1, 307/10.7, 43–46, 48, 64–66
See application file for complete search history.

(56) References Cited

U.S. PATENT DOCUMENTS

| | | | |
|---|---|---|---|
| 6,987,371 B2* | 1/2006 | Kifuku | B62D 5/0463 180/443 |
| RE41,303 E * | 5/2010 | Komatsu | B60L 3/0023 318/434 |
| 7,847,499 B2* | 12/2010 | Nakamura | B60L 3/003 318/400.27 |
| 2012/0013182 A1 | 1/2012 | Minegishi et al. | |
| 2012/0112530 A1 | 5/2012 | Komatsu et al. | |
| 2012/0147635 A1 | 6/2012 | Martinelli | |
| 2012/0243135 A1 | 9/2012 | Butzmann | |

FOREIGN PATENT DOCUMENTS

| | | |
|---|---|---|
| JP | H10-241544 A | 9/1998 |
| JP | H10-243660 A | 9/1998 |
| JP | 2010-110099 A | 5/2010 |
| JP | 2010-148318 A | 7/2010 |
| JP | 2012-100461 A | 5/2012 |
| JP | 2012-130236 A | 7/2012 |
| JP | 4985873 B2 | 7/2012 |
| JP | 2013-506395 A | 2/2013 |

* cited by examiner

| OVERCURRENT DETECTION IC | FIRST ELEMENT INFORMATION | SECOND ELEMENT INFORMATION |
|---|---|---|
| ONLY DRIVE IC RELATED TO UPPER ARM | ○ | ○ |
| OTHER DRIVE ICs |  | ○ |

POWER SUPPLY APPARATUS

TECHNICAL FIELD

The disclosure is related to a power supply apparatus.

BACKGROUND ART

A technique for preventing a fusing (blow-out) of a power supply fuse is known in which when it is detected that an overcurrent flows in a DC/DC converter, a relay contact is opened, power supply to drive circuits for upper and lower arms switching elements is interrupted, and the switching operations of upper and lower arms switching element are stopped to prevent the continuation of the overcurrent flowing through the DC/DC converter (see Patent Literature 1, for example).

CITATION LIST

Patent Literature 1

[PTL 1]
Japanese Laid-open Patent Publication No. 2010-148318

SUMMARY

Technical Problem

However, according to such a configuration as disclosed in Patent Document 1, the fusing of the power supply fuse for a high voltage battery may not be prevented in the case of a short circuit failure of the switching element of the lower arm. According to the configuration disclosed in Patent Document 1, a fuel cell is provided on a secondary side of the DC/DC converter in addition to the high voltage battery, which enables supplying electric power to loads from the fuel cell even if the power supply fuse for the high voltage battery is fused. However, without the fuel cell on the secondary side of the DC/DC converter, supplying the electric power to the loads may not be continued.

Therefore, an object of the present disclosure is to provide a power supply apparatus that is capable of continuing to supply electric power to a load from a battery even in the case of a short circuit failure of a switching element of a lower arm of a DC/DC converter.

Solution to Problem

According to one aspect of the disclosure, a power supply apparatus is provided, which includes:
a power supply;
a DC/DC converter that includes a switching element of an upper arm, a switching element of a lower arm and a reactor, the switching element of the upper arm and the switching element of the lower arm being connected in series between a positive electrode and a negative electrode of the power supply, one end of the reactor being connected between the switching element of the upper arm and the switching element of the lower arm, the other end of the reactor being connected the power supply;
a first switch that is provided between the switching element of the lower arm and the negative electrode of the power supply, the first switch being normally closed;
a power supply fuse that is provided between the positive electrode of the power supply and the other end of the reactor;
a second power supply fuse that is connected to the power supply fuse in parallel;
a second switch that is connected to the second power supply fuse in series and connected to the power supply in parallel, the second switch being normally opened; and
a controller that opens the first switch and closes the second switch upon a short circuit failure of the switching element of the lower arm being detected.

DESCRIPTION OF EMBODIMENTS

In the following, embodiments are described in detail with reference to appended drawings.

Figure 1:
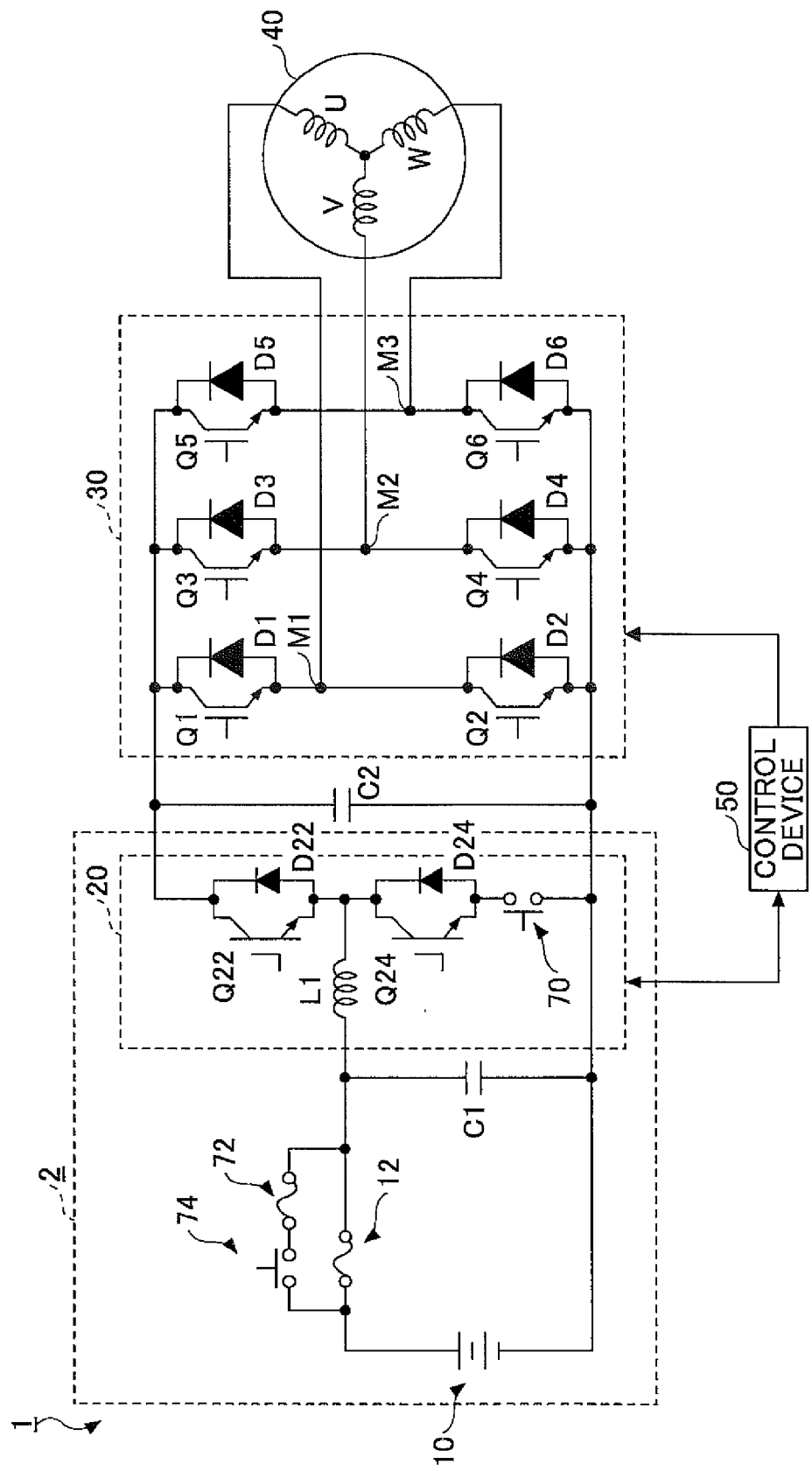
FIG. 1 is a diagram illustrating an example of an overview configuration of a motor drive system 1 for an electric vehicle including an embodiment of a power supply apparatus 2.

FIG. 1 is a diagram illustrating an example of an overview configuration of a motor drive system 1 for an electric vehicle including an embodiment of a power supply apparatus 2. The motor drive system 1 is a system for driving a vehicle travel motor 40 for driving a vehicle using power from a battery 10. It is noted that a type of the electric vehicle or a detailed configuration of the electric vehicle may be arbitrary as long as the electric vehicle is driven with the vehicle travel motor 40 using electric power. Typically, the electric vehicle includes a hybrid vehicle (HV) which uses an internal combustion engine and the vehicle travel motor 40 as a power source and a genuine electric vehicle which uses the vehicle travel motor 40 only as a power source.

The motor drive system 1 includes the battery 10, a DC/DC converter 20, an inverter 30, the vehicle travel motor 40 and a control device 50, as shown in FIG. 1.

The battery 10 is an arbitrary capacitor cell which accumulates energy to output a direct-current voltage. The battery 10 may be configured as a nickel hydrogen battery, a lithium ion battery or a capacitive element such as an electrical double Layer capacitor, etc. It is noted that the battery 10 may be formed as a cell pack obtained by stacking a plurality of an electric cells. It is noted that the battery 10 may be an single power source for the vehicle travel motor 40. In other words, another battery such as a fuel cell may not be provided on an output side of the DC/DC converter 20. However, an alternator or the like may be provided on an input side of the DC/DC converter 20.

The DC/DC converter 20 may be a bidirectional DC/DC converter (a reversible chopper type DC/DC converter). The DC/DC converter 20 may be capable of performing a step-up conversion of 200 V to 650 V, and a step-down conversion of 650 V to 200 V, for example. A filter capacitor C1 may be connected between an input side of a reactor (an inductor) L1 of the DC/DC converter 20 and a negative electrode line.

In the illustrated example, the DC/DC converter 20 includes two switching elements Q22 and Q24, and the reactor L1. The switching elements Q22 and Q24 are connected in series between a positive side line and a negative side line of the inverter 30. The reactor L1 has an end coupled to the positive side of the battery 10 and another end connected to a connection part (midpoint) of two switching elements Q22, Q24.

In the illustrated example, the switching elements Q22 and Q24 of the DC/DC converter 20 are IGBTs (Insulated Gate Bipolar Transistors). It is noted that the switching elements Q22 and Q24 may be ordinary IGBTs which include diodes (freewheel diodes, for example) D22 and D24 that are externally provided, or RC (Reverse Conducting)—IGBTs that internally include the diodes D22 and D24. In any case, a collector of the switching element Q22 of an upper arm is connected to the positive side line of the inverter 30, and an emitter of the switching element Q22 of the upper arm is connected to a collector of the switching element Q24 of a lower arm. Further, the emitter of the switching element Q24 of the lower arm is connected to a negative side line of the inverter 30 and a negative electrode of the battery 10. It is noted that the switching elements Q22 and Q24 may be transistors other than IGBTs, such as MOSFETs (metal oxide semiconductor field-effect transistor), etc.

The inverter 30 includes arms of U-V-W phases disposed in parallel between the positive side lines and the negative side line. The U-phase arm includes switching elements (IGBT in this example) Q1 and Q2 connected in series, the V-phase arm includes switching elements (IGBT in this example) Q3 and Q4 connected in series and the W-phase arm includes switching elements (IGBT in this example) Q5 and Q6 connected in series. Further, diodes D1-D6 are provided between collectors and emitters of the switching elements Q1-Q6, respectively. It is noted that the switching elements Q1-Q6 may be transistors other than IGBTs, such as MOSFETs, etc.

The vehicle travel motor 40 is a three-phase permanent-magnetic motor and one end of each coil of the U, V and W phases is commonly connected at a midpoint therebetween. The other end of the coil of U-phase is connected to a midpoint M1 between the switching elements Q1 and Q2, the other end of the coil of V-phase is connected to a midpoint M2 between the switching elements Q3 and Q4 and the other end of the coil of W-phase is connected to a midpoint M3 between the switching elements Q5 and Q6. A smoothing capacitor C2 is connected between a collector of the switching element Q1 and the negative electrode line. It is noted that a way of connecting the three coils of U, V and W phases may be delta connection. Further, the vehicle travel motor 40 may be a hybrid three-phase motor that includes an electromagnet and a permanent magnet in combination.

It is noted that, in addition to the vehicle travel motor 40, a second motor for driving a vehicle or a generator may be added in parallel with respect to the vehicle travel motor 40. In this case, a corresponding inverter may be added in parallel.

The control device 50 controls the DC/DC converter 20. Further, the control device 50 controls a lower arm relay 70 and a second fuse relay 74 that are described hereinafter. Further, the control device 50 may control the inverter 30. The control device 50 may be an ECU (Electronic Control Unit) that includes a microcomputer. Functions of the control device 50 (including functions described hereinafter) may be implemented by any hardware, any software, any firmware or any combination thereof. For example, the functions of the control device 50 may be implemented by an ASIC (application-specific integrated circuit) and a FPGA (Field Programmable Gate Array). Further, the functions of the control device 50 may be implemented by a plurality of ECUs in cooperation.

A general way of controlling the DC/DC converter 20 may be arbitrary. Typically, the control device 50 controls the DC/DC converter 20 according to an operation state (a powering operation or a regenerating operation) of the inverter 30. For example, at the time of the powering operation, the control device 50 performs the ON/OFF switching of only the switching element Q24 of the lower arm (i.e., a single-arm drive by the lower arm) to increase the voltage of the battery 10 and output the increased voltage to the side of the inverter 30. In this case, the switching element Q24 of the lower arm may be controlled with PMW (Pulse Width Modulation). Further, at the time of the regenerating operation, the semiconductor drive device 50 performs the ON/OFF switching of only the switching element Q22 of the upper arm (i.e., a single-arm drive by the upper arm) to decrease the voltage on the side of the inverter 30 and output the decreased voltage to the side of the battery 10. In this case, the switching element Q22 of the upper arm may be controlled with PMW. Further, the control device 50 may performs the ON/OFF switching of the switching elements Q22 and Q24 in a reversed phase (i.e., a double-arm drive) when the current flowing through the reactor L1 crosses 0 (at the time of a zero cross event).

A general way of controlling the inverter 30 may be arbitrary. Typically, the control device 50 drives the switching elements Q1 and Q2 related to the U-phase to be turned on/off, the switching elements Q3 and Q4 related to the V-phase to be turned on/off and the switching elements Q5 and Q6 related to the W-phase to be turned on/off such that phase currents flowing through coils of the corresponding (U, V or W) phases are varied in a sine curve and have a relationship of phases shifted by 120 degrees with respect to each other.

Next, again with reference to FIG. 1, the power supply apparatus 2 according to an embodiment is described. The power supply apparatus 2 includes the battery 10, the DC/DC converter 20, a power supply fuse 12, the control device 50, the lower arm relay 70, a second power supply fuse 72 and the second fuse relay 74.

The power supply fuse 12 is connected in series to the positive side of the battery 10. In the example illustrated in FIG. 1, the power supply fuse 12 is connected between the positive side of the battery 10 and the positive side of the filter capacitor C1.

The lower arm relay 70 is provided between the switching element Q24 of the lower arm and the negative side of the battery 10 (i.e., the negative electrode line of the inverter 30). Specifically, the emitter of the switching element Q24 of the lower arm is connected to a negative side line of the inverter 30 and a negative pole of the battery 10 via the lower arm relay 70. The lower arm relay 70 is normally closed. It is noted that "normally" means a state at a time of performing normal control (a powering state and a regenerating state) and excludes an operation state at a time of emergency travel described hereinafter. Typically, the lower arm relay 70 is of a type (normally closed type) that is closed as a characteristic of the element itself in a state in which no electric power is supplied; however, the lower arm relay 70 may be of a type (normally open type) that is open as a characteristic of the element itself in a state in which no electric power is supplied. In the case of the normally open type, the lower arm relay 70 is normally closed as a result of the control. The open/close state of the lower arm relay 70 is controlled by the control device 50.

The second power supply fuse 72 is connected to the power supply fuse 12 in parallel. In the example illustrated in FIG. 1, the second power supply fuse 72 is connected between the positive side of the battery 10 and the positive side of the filter capacitor C1 and in parallel with the power supply fuse 12. It is noted that the second power supply fuse 72 may have the same fusing characteristic as the power supply fuse 12, or the second power supply fuse 72 and the power supply fuse 12 may have different fusing characteristics.

The second fuse relay 74 is connected to the second power supply fuse 72 in series and the power supply fuse 12 in parallel. Specifically, the second fuse relay 74 and the second power supply fuse 72 that are connected in series are connected to the power supply fuse 12 in parallel. The second fuse relay 74 is normally opened. Similarly, "normally" herein means a state at a time of performing normal control (a powering state and a regenerating state) and excludes an operation state at a time of emergency travel described hereinafter. Typically, the second fuse relay 74 is of a type (normally open type) that is opened as a characteristic of the element itself in a state in which no electric power is supplied; however, the second fuse relay 74 may be of a type (normally closed type) that is closed as a characteristic of the element itself in a state in which no electric power is supplied. In the case of the normally closed type, the second fuse relay 74 is normally opened as a result of the control. The open/close state of the second fuse relay 74 is controlled by the control device 50.

Figure 2:
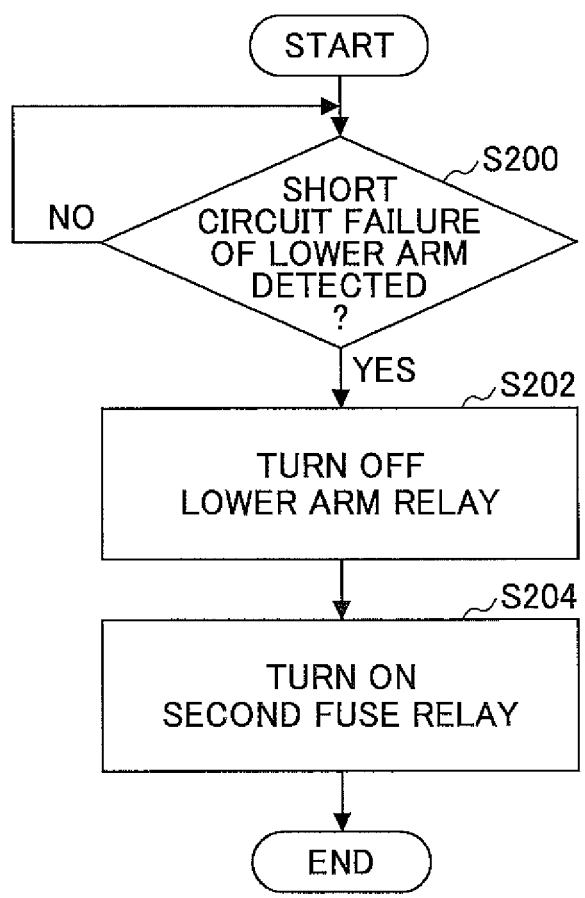
FIG. 2 is a flowchart illustrating an example of a process executed by a control device 50 with respect to a short circuit of a switching element Q24 of a lower arm.

FIG. 2 is a flowchart illustrating an example of a process executed by the control device 50 with respect to a short circuit of the switching element Q24 of a lower arm. The process routine illustrated in FIG. 2 is performed repeatedly at a predetermined cycle during the operation of the power supply apparatus 2 (i.e., during a period in which the vehicle travel motor 40 is driven).

In step S200, it is determined whether the short circuit failure of the switching element Q24 of the lower arm is detected. A way of detecting the short circuit failure of the switching element Q24 of the lower arm is arbitrary (examples thereof are described hereinafter). If it is determined that the short circuit failure of the switching element Q24 of the lower arm is detected, the process routine goes to step S202, otherwise the process in step S200 is performed at the next cycle (i.e., a state for waiting for the detection of the short circuit failure of the switching element Q24 of the lower arm).

In step S202, the lower arm relay 70 is turned off (i.e., opened). As a result of this process, the short circuit state of the lower arm due to the short circuit failure of the switching element Q24 of the lower arm is cleared.

In step S204, the second fuse relay 74 is turned on (i.e., closed).

Here, when the short circuit failure of the switching element Q24 of the lower arm occurs, the overcurrent from the battery 10 may cause the power supply fuse 12 to be fused. However, according to the process illustrated in FIG. 2, even if the power supply fuse 12 is fused due to the short circuit failure of the switching element Q24 of the lower arm, the second fuse relay 74 is closed, which enables supplying the electric power to the vehicle travel motor 40 from the battery 10 via the second power supply fuse 72 and the second fuse relay 74. Therefore, the vehicle travel motor 40 can be driven with a low voltage (the same as the battery voltage Vb of the battery 10) that is not increased, which enables the emergency travel with the vehicle travel motor 40. Further, according to the process illustrated in FIG. 2, when the short circuit failure of the switching element Q24 of the lower arm is detected, the lower arm relay 70 is opened, which clears the short circuit state of the lower arm. With this arrangement, the overcurrent from the battery 10 is prevented, which can protect the battery 10.

It is noted that, in the example illustrated in FIG. 2, unlike an example illustrated in FIG. 3, etc., described hereinafter, the processes of step S202 and step S204 are performed without detecting the fusing of the power supply fuse 12. This is based on a fact that, when the short circuit failure of the switching element Q24 of the lower arm is detected, a probability that the power supply fuse 12 has been fused before the short circuit failure of the switching element Q24 is detected is high. However, in fact, there may be a case where the power supply fuse 12 has not been fused when the short circuit failure of the switching element Q24 is detected. In this case, the power supply fuse 12 and the second power supply fuse 72 function in parallel, which causes a change in the fuse characteristics; however, such a change may be permissible in such a failed state as the short circuit failure of the switching element Q24 of the lower arm, in particular.

Figure 3:
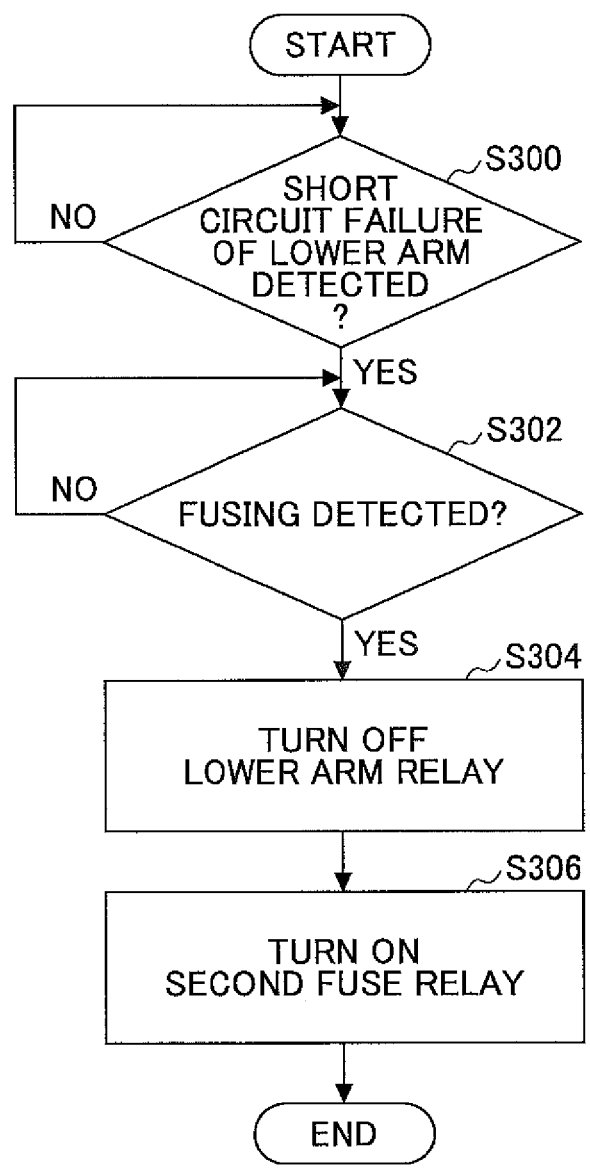
FIG. 3 is a flowchart illustrating another example of a process executed by the control device 50 with respect to the short circuit of the switching element Q24 of the lower arm.

FIG. 3 is a flowchart illustrating another example of a process executed by the control device 50 with respect to the short circuit of the switching element Q24 of the lower arm. The process routine illustrated in FIG. 3 is performed repeatedly at a predetermined cycle during the operation of the power supply apparatus 2 (i.e., during a period in which the vehicle travel motor 40 is driven). The process illustrated in FIG. 3 differs from the process illustrated in FIG. 2 in that a process of step 302 is added. In the following, the process different from the process illustrated in FIG. 2 is mainly described.

In step S300, it is determined whether the short circuit failure of the switching element Q24 of the lower arm is detected. If it is determined that the short circuit failure of the switching element Q24 of the lower arm is detected, the process routine goes to step S302, otherwise the process in step S300 is performed at the next cycle.

In step S302, it is determined whether the fusing of the power supply fuse 12 is detected. A way of detecting the fusing of the power supply fuse 12 is arbitrary. For example, it may be detected based on information from a current sensor (not illustrated) that detects the current from the battery 10. In this case, values of time and current required for the fusing of the power supply fuse 12 are predetermined as fusing determination thresholds based on (known) fusing characteristics of the power supply fuse 12. In this case, when the values of time and current that exceed the fusing determination thresholds are detected, it may be determined that the power supply fuse 12 is fused. If it is determined that the fusing of the power supply fuse 12 is detected, the process routine goes to step S304, otherwise the process of step S302 is performed at the next cycle (i.e., a state for waiting for the detection of the fusing of the power supply fuse 12).

In step S304, the lower arm relay 70 is turned off (i.e., opened).

In step S306, the second fuse relay 74 is turned on (i.e., closed).

According to the process illustrated in FIG. 3, when the short circuit failure of the switching element Q24 of the lower arm is detected, the lower arm relay 70 is opened. With this arrangement, the short circuit state of the lower arm is cleared, and thus the overcurrent from the battery 10 is prevented, which can protect the battery 10. Further, according to the process illustrated in FIG. 3, when the fusing of the power supply fuse 12 is detected, the second fuse relay 74 is closed. With this arrangement, the electric power can be supplied to the vehicle travel motor 40 from the battery 10 via the second power supply fuse 72 and the second fuse relay 74, which enables the emergency travel with the vehicle travel motor 40.

It is noted that according to the process illustrated in FIG. 3, the presence or absence of the fusing of the power supply fuse 12 is detected after the short circuit failure of the switching element Q24 of the lower arm has been detected; however, these may be reversed. Specifically, the presence or absence of the short circuit failure of the switching element Q24 of the lower arm may be determined after the fusing of the power supply fuse 12 has been detected.

Figure 4:
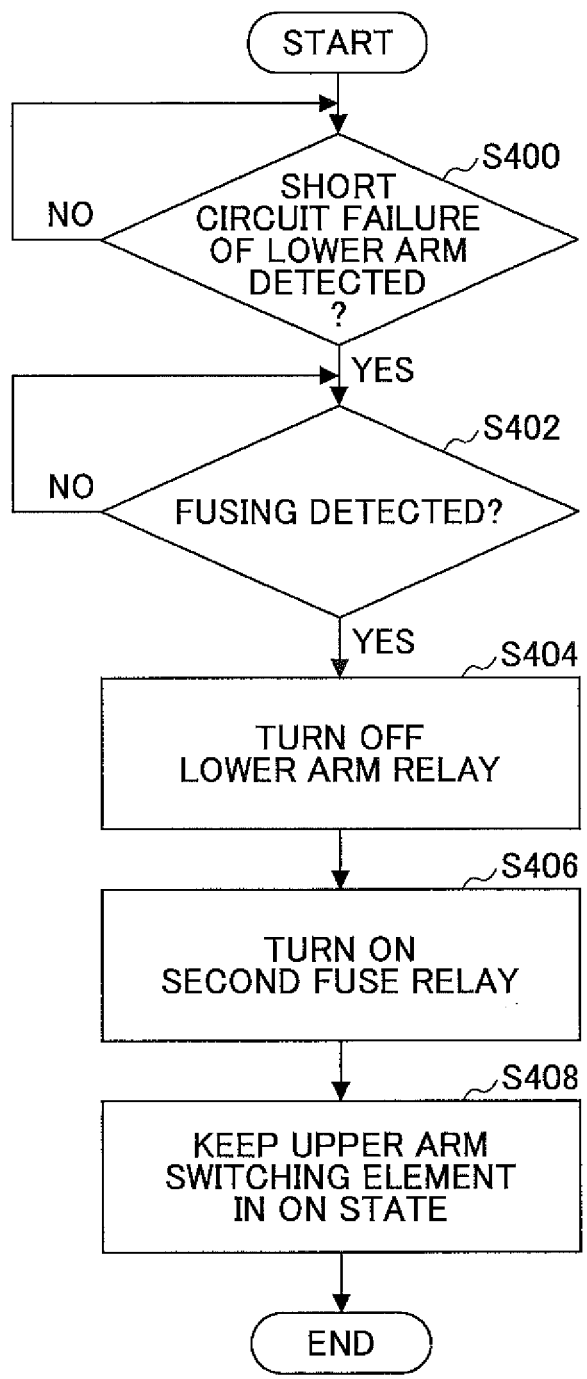
FIG. 4 is a flowchart illustrating further another example of a process executed by the control device with respect to the short circuit of the switching element Q24 of the lower arm.

FIG. 4 is a flowchart illustrating further another example of a process executed by the control device 50 with respect to the short circuit of the switching element Q24 of the lower arm. The process routine illustrated in FIG. 4 is performed repeatedly at a predetermined cycle during the operation of the power supply apparatus 2 (i.e., during a period in which the vehicle travel motor 40 is driven). The process illustrated in FIG. 4 differs from the process illustrated in FIG. 3 in that a process of step 408 is added. Specifically, the respective processes of step S400 through step S406 may be the same as the processes of step S300 through step S306.

In step S408, the switching element Q22 of the upper arm is kept in its ON state. It is noted that, if the switching element Q22 of the upper arm is in its OFF state, the switching element Q22 of the upper arm is turned on and then is kept in its ON state. With this arrangement, the regenerated current from the inverter 30 can be brought to the side of the battery 10, while the emergency travel with the vehicle travel motor 40 can be implemented. It is noted that, instead of keeping the switching element Q22 of the upper arm in its ON state, the switching element Q22 of the upper arm may be switched on and off (i.e., a single arm drive with the upper arm may be implemented).

It is noted that, in the process illustrated in FIG. 4, as is the case with the process illustrated in FIG. 2, the process of step S400 may be omitted.

Next, an example of a way of detecting a short circuit failure of the switching element Q24 of the lower arm is described. It is noted that the way described hereinafter may be used for the process of step S200 in FIG. 2, the process of step S300 in FIG. 3 and the process of step S400 in FIG. 4.

Figure 5:
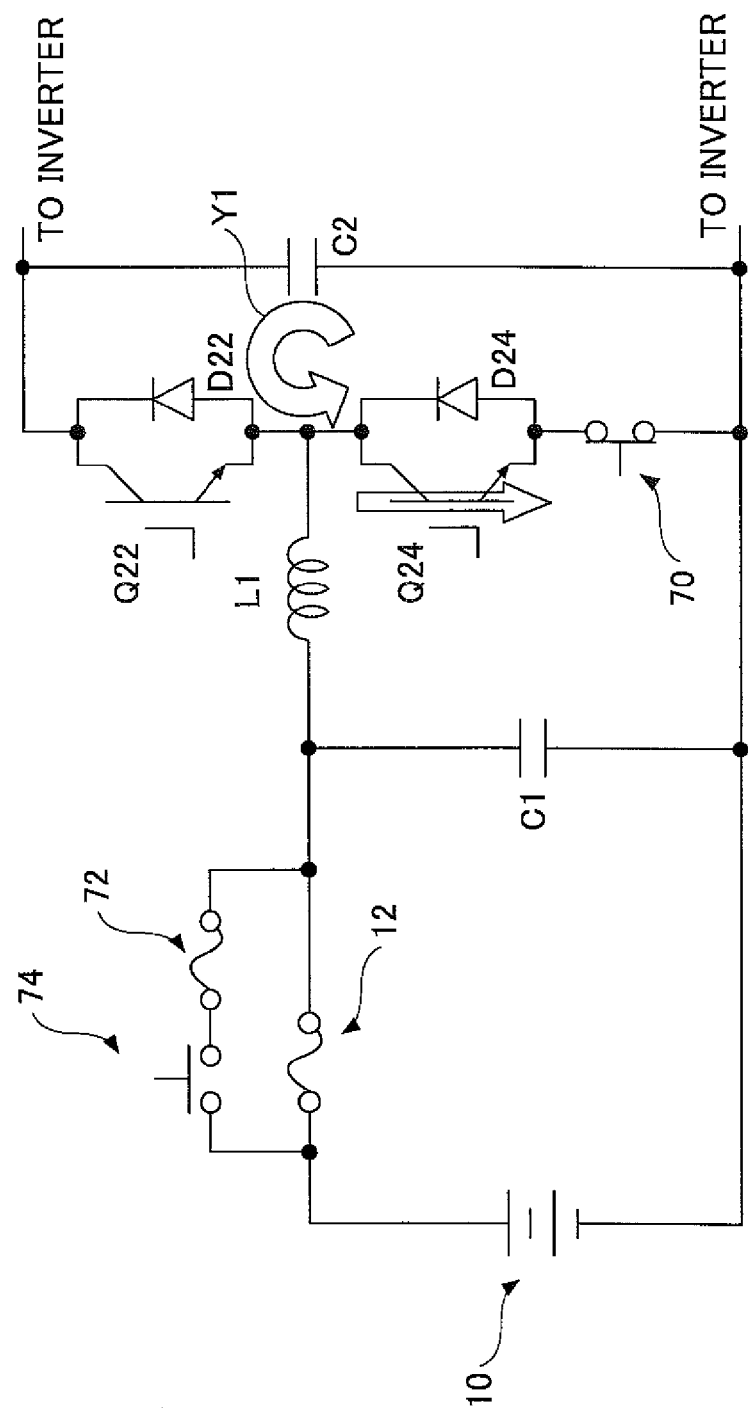
FIG. 5 is a diagram explaining an example of a way of detecting a short circuit failure of the switching element Q24 of the lower arm.

FIG. 5 is a diagram explaining an example of a way of detecting the short circuit failure of the switching element Q24 of the lower arm.

If the short circuit failure of the switching element Q24 of the lower arm occurs at the time of the powering operation, and the switching element Q22 of the upper arm is turned on at the subsequent regenerating operation, the upper and lower arms are shorted at timing when the switching element Q22 of the upper arm is turned on. At that time, as schematically illustrated with an arrow Y1 in FIG. 5, electrical charges accumulated in the smoothing capacitor C2 flow through the switching element Q22 of the upper arm as a short circuit current. Based on this characteristics, the short circuit of the switching element Q24 of the lower arm may be detected on the value of the current flowing through the switching element Q22 of the upper arm. For example, when the current value from a current sensor (a sense emitter SE) that may be provided in the switching element Q22 of the upper arm exceeds a predetermined value (i.e., the overcurrent is detected), it may be determined that the short circuit failure of the switching element Q24 of the lower arm is detected.

Next, an example of a way of detecting the fusing of the power supply fuse 12 is described. It is noted that the way described hereinafter may be used for the process of step S302 in FIG. 3 and the process of step S402 in FIG. 4.

Figure 6:
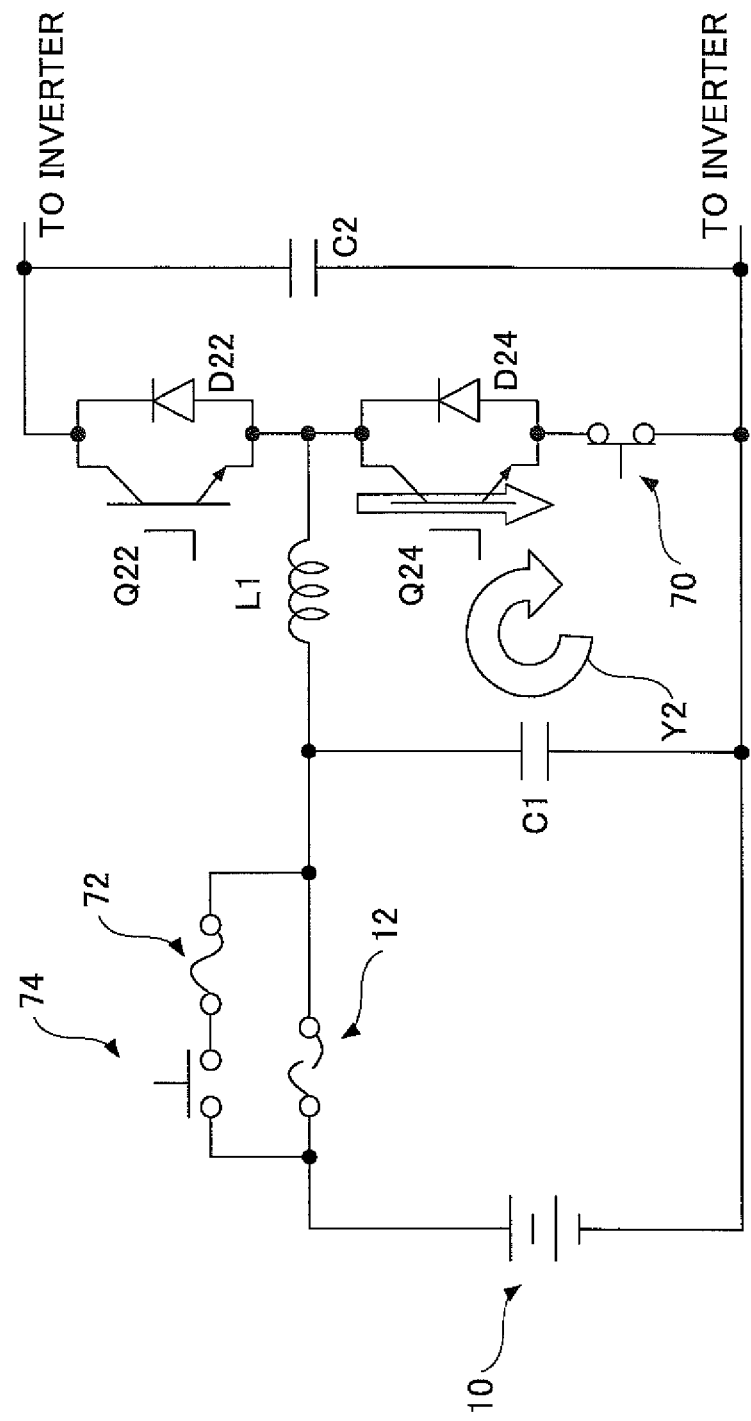
FIG. 6 is a diagram explaining an example of a way of detecting a fusing of a power supply fuse 12.

FIG. 6 is a diagram explaining an example of a way of detecting the fusing of the power supply fuse 12.

When the short circuit failure of the switching element Q24 of the lower arm occurs, the switching element Q24 of the lower arm cannot be turned off, and thus the electrical charges accumulated in the filter capacitor C1 flow as a short circuit current, as schematically illustrated with an arrow Y2 in FIG. 6. Further, substantially concurrently with this, the power supply fuse 12 is fused. With this arrangement, the voltage across the filter capacitor C1 decreases (i.e., decreases to substantially 0) such that the voltage becomes smaller than the battery voltage Vb (i.e., the voltage of the battery 10). In order to utilize this fact, the fusing of the power supply fuse 12 may be detected based on the voltage across the filter capacitor C1. For example, when the voltage across the filter capacitor C1 decreases from the value near the battery voltage Vb to a value less than a predetermined voltage, the fusing of the power supply fuse 12 may be detected. In this case, the predetermined voltage is substantially less than the battery voltage Vb, and may be a value that is slightly greater than 0.

It is noted that the voltage across the filter capacitor C1 decreases to the value substantially smaller than the battery voltage Vb due to the short circuit failure of the switching element Q24 of the lower arm, as described above. Thus, the short circuit failure of the switching element Q24 of the lower arm may also be detected based on the voltage across the filter capacitor C1. For example, when the voltage across the filter capacitor C1 decreases from the value near the battery voltage Vb to a value less than a predetermined voltage, the short circuit failure of the switching element Q24 of the lower arm and the fusing of the power supply fuse 12 may be detected simultaneously.

Next, a preferred example of a configuration of the control device 50 is described.

Figure 7:
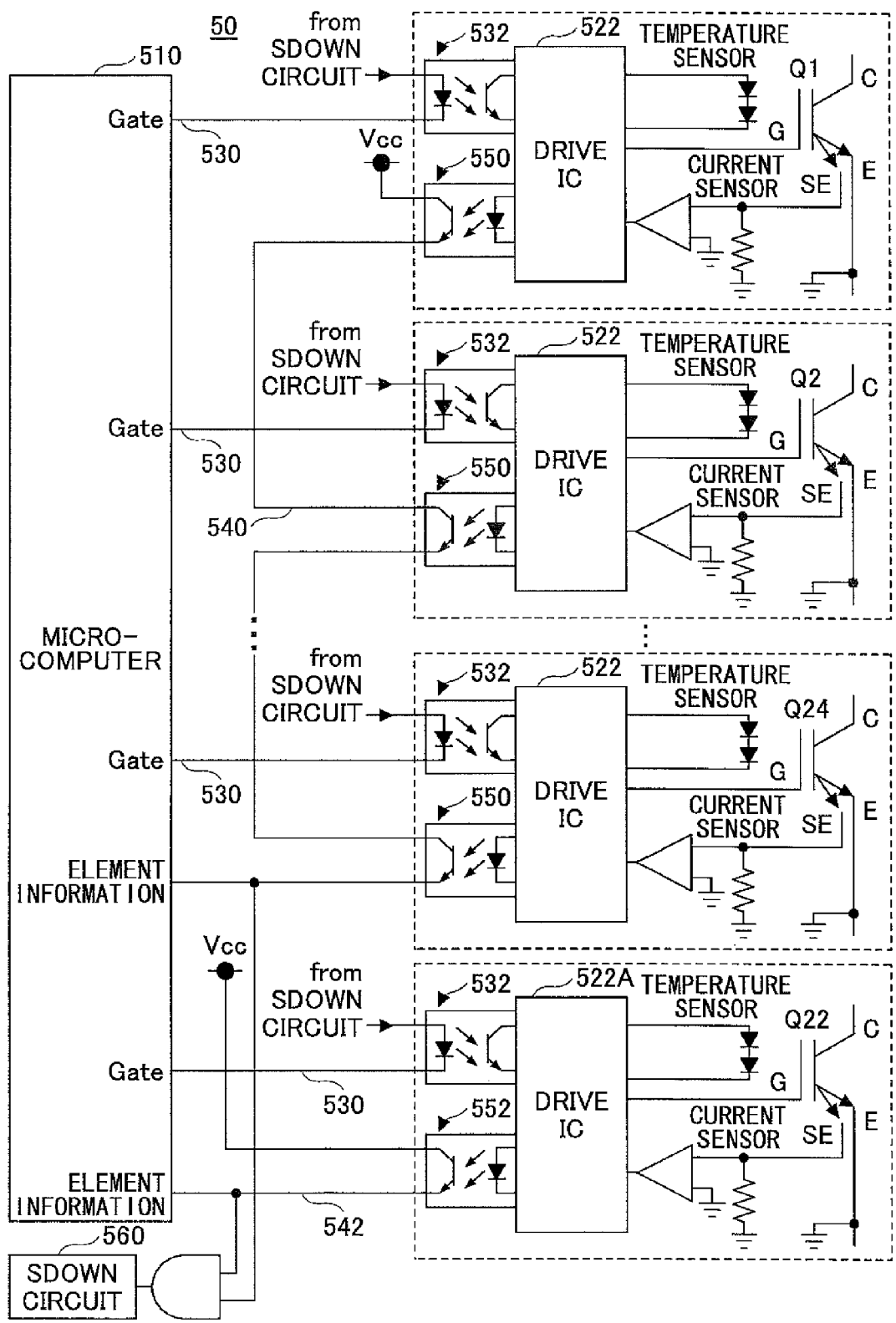
FIG. 7 is a diagram illustrating an example of a configuration of the control device 50.

FIG. 7 is a diagram illustrating an example of a configuration of the control device 50. It is noted that, in FIG. 7, the switching elements Q1 through Q6 (the switching elements Q3 through Q6 are not illustrated) of the inverter 30, and the switching elements Q22 and Q24 of the DC/DC converter 20 are illustrated. It is noted that, in the following, the control device 50 includes a configuration that controls the switching elements Q1 through Q6 of the inverter 30 as well as the switching elements Q22 and Q24 of the DC/DC converter 20; however, a part of the configuration that controls the switching elements Q1 through Q6 of the inverter 30 may be omitted (i.e., may be implemented by another control device).

The control device 50 includes a microcomputer 510 and drive IC (integrated circuit) parts 522. The respective drive IC parts 522 are provided for the switching elements Q1 through Q6 of the inverter 30, and the switching elements Q22 and Q24 of the DC/DC converter 20, respectively, such that total eight drive IC parts 522 are provided. However, the drive IC parts 522 may be unified as a single drive IC as a package. In such a case, circuit parts corresponding to the drive IC parts 522 are included in the single drive IC.

Gate signal communication lines 530 are provided between the microcomputer 510 and the drive IC parts 522. The gate signal communication lines 530 are provided for the switching elements Q1 through Q6 of the inverter 30, and the switching elements Q22 and Q24 of the DC/DC converter 20, respectively, such that total eight gate signal communication lines 530 are provided.

Gate signals for switching the switching elements Q1 through Q6 on/off are transmitted through the gate signal communication lines 530 for the switching elements Q1 through Q6 of the inverter 30. Specifically, the respective gate signals are applied to gates of the switching elements Q1 through Q6 via the gate signal communication lines 530 and the drive IC parts 522.

Gate signals for switching the switching elements Q22 and Q24 of the DC/DC converter 20 on/off are transmitted through the gate signal communication lines 530 for the switching elements Q22 and Q24. Specifically, the respective gate signals are applied to gates of the switching elements Q22 and Q24 via the gate signal communication lines 530 and the drive IC parts 522.

Feedback communication lines 540, 542 are provided between the microcomputer 510 and the drive IC parts 522. The feedback communication line 540 is shared between the seven drive IC parts 522, as illustrated in FIG. 7. On the other hand, the feedback communication line 542 is provided exclusively for the drive IC parts 522 related to the switching element Q22 of the upper arm. In the following, reference numeral "522A" is used for the drive IC parts 522 related to the switching element Q22 of the upper arm, if necessary, in order to distinguish it from other drive IC parts 522.

The feedback communication line 540 has one end connected to a point of the power supply voltage Vcc and the other end connected to the microcomputer 510. The feedback communication line 540 includes seven photocouplers 550 provided for the seven drive IC parts 522, respectively. The seven photocouplers 550 (transistors on output sides) may be connected in series or in parallel between the point of the power supply voltage Vcc and the microcomputer 510, as illustrated in FIG. 7. The drive IC parts 522 transmit feedback signals (element information) to the microcomputer 510 by turning on/off the corresponding photocouplers 550 to change a level of the feedback communication line 540 between "Hi" and "Lo". It is noted that the level of the feedback communication line 540 is kept at "Hi" during a non-transmission period of the feedback signal. The feedback signal is further described hereinafter.

The feedback communication line 542 has one end connected to a point of the power supply voltage Vcc and the other end connected to the microcomputer 510 such that the feedback communication line 542 is connected to the point of the power supply voltage Vcc and the microcomputer 510 separately from the feedback communication line 540. The feedback communication line 542 includes a photocoupler 552. The drive IC part 522A related to the switching element Q22 of the upper arm transmits a feedback signal (element information) to the microcomputer 510 by turning on/off the photocoupler 552 to change a level of the feedback communication line 542 between "Hi" and "Lo". It is noted that the level of the feedback communication line 542 is kept at "Hi" during a non-transmission period of the feedback signal. The feedback signal is further described hereinafter.

The feedback signal from the seven drive IC parts 522 (other than the drive IC part 522A related to the switching element Q22 of the upper arm) may include unique information and abnormality status information. The feedback signal may be generated only once to be transmitted to the microcomputer 510, or may be generated repeatedly during a period of the abnormality to be transmitted to the microcomputer 510. The unique information may be ID information for identifying the switching elements Q1 through Q6 and Q24, respectively. The abnormality status information represents a content of the abnormality. There may be a plurality of contents of the abnormality according to the abnormalities that can be detected (determined). For example, the contents of the abnormality may include information that represents a protection operation content when protection functions of the drive IC parts 522 work. The protection functions may include anti-short circuit protection, anti-overcurrent protection, anti-overheat protection, anti-abnormal voltage protection, substrate part failure detection, etc.

On the other hand, the feedback signal from the drive IC part 522A related to the switching element Q22 of the upper arm may not include unique information. Specifically, the feedback signal from the drive IC part 522A includes only the abnormality status information, among the unique information and the abnormality status information. The feedback signal may be generated only once to be transmitted to the microcomputer 510, or may be generated repeatedly during a period of the abnormality to be transmitted to the microcomputer 510.

The seven drive IC parts 522 (other than the drive IC part 522A related to the switching element Q22 of the upper arm) generate the feedback signals and transmit the feedback signals to the microcomputer 510 at the time of detecting the abnormality (i.e., at the time of operating the protection). At that time, the drive IC parts 522 transmit the feedback signals that include the unique information of the corresponding switching element, among the switching elements Q1 through Q6, and Q24, and the abnormality status information according to the detected abnormality. It is noted that, for this purpose, the drive IC parts 522 include storage parts (not illustrated) that store the unique information, etc., related to the corresponding switching element. The storage parts may be EEPROMs (electrically erasable programmable ROM), etc. It is noted that when the microcomputer 510 receives the feedback signal, the microcomputer 510 determines, based on the unique information and the abnormality status information, which switching element, among the switching elements Q1 through Q6, and Q24, is abnormal and type of the abnormality, and performs a process (an emergency operation, for example) according to a determination result.

Similarly, the drive IC part 522A related to the switching element Q22 of the upper arm generates the feedback signal and transmits the feedback signal to the microcomputer 510 at the time of detecting the abnormality (i.e., at the time of operating the protection). The drive IC part 522A transmits the feedback signal, which includes the abnormality status information according to the detected abnormality, to the microcomputer 510. For example, when the short circuit failure of the switching element Q24 of the lower arm occurs, the drive IC part 522A detects, based on the abnormality in the current value of the current sensor (i.e., the sense emitter), the short circuit failure of the switching element Q24 of the lower arm, and transmits the feedback signal to the microcomputer 510. Specifically, the drive IC part 522A related to the switching element Q22 of the upper arm generates the feedback signal which includes the abnormality status information according to the short circuit failure, and transmits the feedback signal to the microcomputer 510 via the feedback communication line 542. It is noted that, in general, the drive IC part 522 related to the switching element Q24 of the lower arm cannot detect the short circuit failure of the switching element Q24 of its own. The microcomputer 510 determines that the short circuit failure of the switching element Q24 of the lower arm, which is opposed to the switching element Q22 of the upper arm, occurs based on the received abnormality status information (see step S300 in FIG. 3, step S400 in FIG. 4, etc.).

According to the example illustrated in FIG. 7, since the feedback communication line 542 is provided exclusively for the drive IC part 522A related to the switching element Q22 of the upper arm, the short circuit failure of the switching element Q24 of the lower arm can be detected by the microcomputer 510 with high reliability. However, by including the unique information in the feedback signal, it becomes possible for the microcomputer 510 to determine which switching element is abnormal and what kind of abnormality the switching element has. Thus, the feedback communication line 542 may be unified with the feedback communication line 540. Specifically, the feedback communication line 542 may be omitted, and the drive IC part 522A related to the switching element Q22 of the upper arm may transmit the feedback signal via the feedback communication line 540, as is the case with other drive IC parts 522.

Further, in the example illustrated in FIG. 7, the feedback communication lines 540, 542 are connected to a shutdown circuit (SDOWN circuit) 560; however, the feedback communication lines 540, 542 may not be connected to the SDOWN circuit 560. Specifically, in the example illustrated in FIG. 7, communication lines related to the SDOWN circuit 560 are formed by utilizing a part of the feedback communication lines 540, 542; however, the feedback communication lines 540, 542 may be formed independently from the communication lines related to the SDOWN circuit 560. In this case, the level of the feedback communication line 542 is kept at "Lo" during the non-transmission period of the feedback signal. It is noted that the SDOWN circuit 560 has a function of protecting the neighboring arm from being broken due to the failed arm at the time of the short circuit failure. In other words, the SDOWN circuit 560 is a circuit for stopping the operation of the switching element of the neighboring arm (immediately without using the microcomputer 510) in response to a shutdown signal from the corresponding drive IC part 522 at the time of the short circuit failure. Specifically, when the shutdown signal ("Lo" level) from the corresponding drive IC part 522 is input to the SDOWN circuit 560, the output of the SDOWN circuit 560 become "Lo" level. This causes the inputs of the drive IC parts 522 to be "Lo" level (i.e., this causes the respective photodiode 532 to turn off), which in turn causes all the switching elements Q1 through Q6 and the switching elements Q22 and Q24 to be turned off (however, the switching element with the short circuit failure cannot be turned off). It is noted that, in the example illustrated in FIG. 7, the feedback communication lines 540, 542 may be connected to the SDOWN circuit 560 via a low-pass filter such that the shutdown operation is not performed due to the feedback signal.

Further, in the example illustrated in FIG. 7, the feedback communication line 540 is shared between the seven drive IC parts 522 (other than the drive IC part 522A related to the switching element Q22 of the upper arm); however, the feedback communication lines 540 may be provided exclusively for the drive IC parts 522. In this case, the unique information in the feedback signal becomes unnecessary. Alternatively, the feedback communication line may be provided for each pair when pairs of the drive IC parts 522 are formed in a predetermined combination.

Further, in the example illustrated in FIG. 7, the feedback signal from the seven drive IC parts 522 (other than the drive IC part 522A related to the switching element Q22 of the upper arm) includes the unique information. However, in the case where only the presence or absence of the abnormality may be detected (i.e., it is not necessary to determine which switching element is abnormal), the feedback signal from the seven drive IC parts 522 may not include the unique information.

Figure 8:
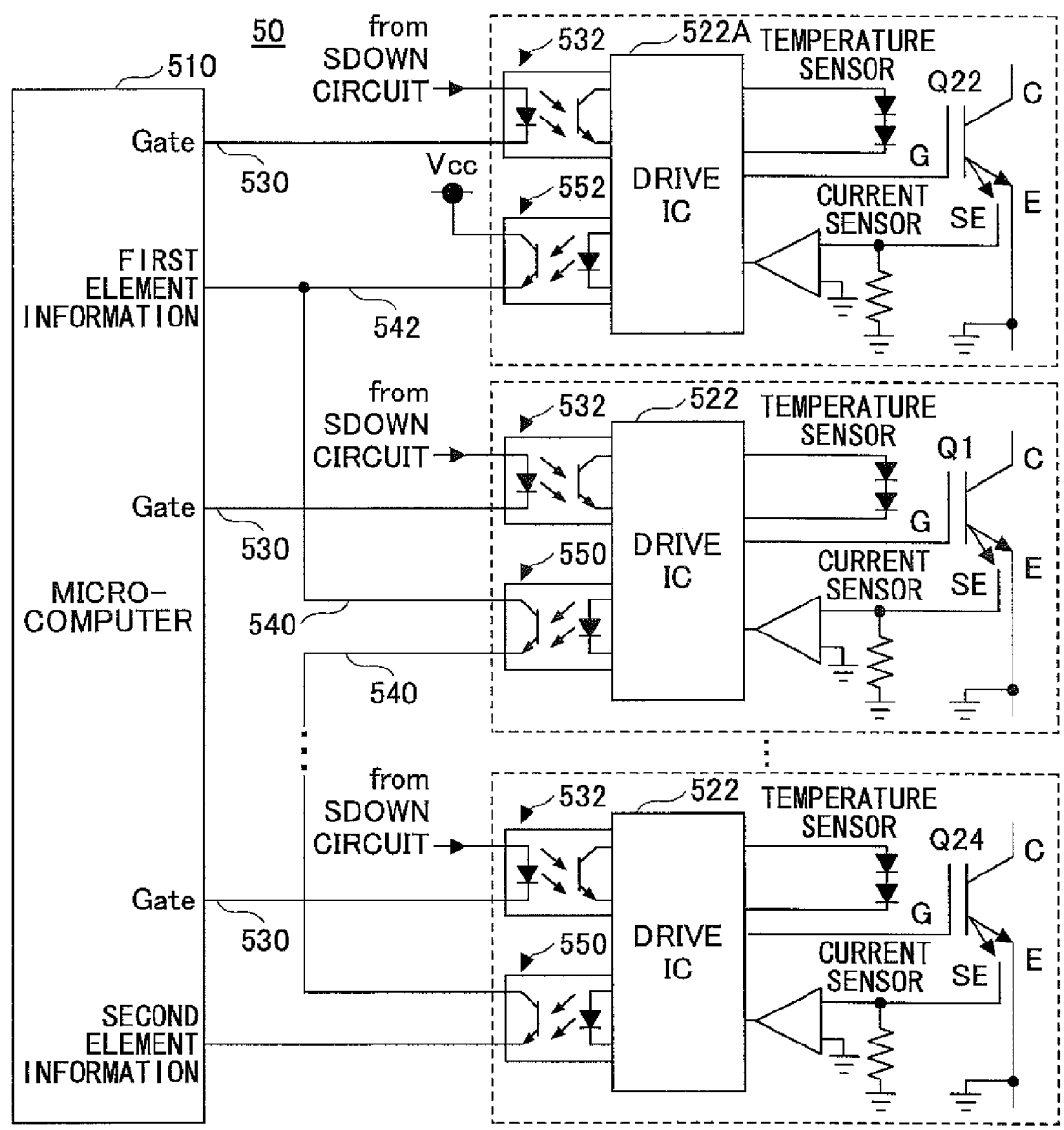
FIG. 8 is a diagram illustrating another example of a configuration of the control device 50.

FIG. 8 is a diagram illustrating another example of a configuration of the control device 50. It is noted that, in FIG. 8, the switching elements Q1 through Q6 (the switching elements Q2 through Q6 are not illustrated) of the inverter 30, and the switching elements Q22 and Q24 of the DC/DC converter 20 are illustrated.

The example illustrated in FIG. 8 differs from the example illustrated in FIG. 7 in a connection way of the feedback communication lines 540, 542. In the following, a different part of a configuration is mainly described. Other parts of the configuration may be the same as those illustrated in FIG. 7.

The feedback communication line 542 has one end connected to a point of the power supply voltage Vcc and the other end connected to the microcomputer 510. The feedback communication line 542 includes a photocoupler 552. The drive IC part 522A related to the switching element Q22 of the upper arm transmits a feedback signal (first element information) to the microcomputer 510 by turning on/off the photocoupler 552 to change a level of the feedback communication line 542 between "Hi" and "Lo". It is noted that the drive IC part 522A related to the switching element Q22 of the upper arm keeps the photocoupler 552 in its ON state during a non-transmission period of the feedback signal.

The feedback communication line 540 has one end connected to the feedback communication line 542 and the other end connected to the microcomputer 510. In other words, the feedback communication line 540 is connected to the point of the (common) power supply voltage Vcc via the feedback communication line 542. The feedback communication line 540 includes seven photocouplers 550 that are provided for the respective seven drive IC parts 522 (other than the drive IC part 522A related to the switching element Q22 of the upper arm). The seven photocouplers 550 (transistors on output sides) may be connected in series or in parallel between the point of the power supply voltage Vcc and the microcomputer 510, as illustrated in FIG. 8. The drive IC parts 522 transmit feedback signals (second element information) to the microcomputer 510 by turning on/off the corresponding photocouplers 550 to change a level of the feedback communication line 540 between "Hi" and "Lo". It is noted that the drive IC parts 522 keep the photocouplers 550 in their ON state during a non-transmission period of the feedback signal.

The feedback signal (i.e., the first element information) from the feedback communication line 542 and the feedback signal (i.e., the second element information) from the feedback communication line 540 may be the same, and may include the abnormality status information, for example. In other words, the drive IC part 522A and other drive IC parts 522 may generate the feedback signals, which don't include the unique information, and transmit the feedback signals to the microcomputer 510.

In the example illustrated in FIG. 8, the feedback communication line 542 is disposed closer to the point of the power supply voltage Vcc, compared to the feedback communication line 540. Thus, when the level of the feedback communication line 542 becomes "Lo", the level of the feedback communication line 540 becomes "Lo" correspondingly. On the other hand, when the level of the feedback communication line 540 becomes "Lo", the level of the feedback communication line 542 does not always become "Lo". Specifically, even if the level of the feedback communication line 540 becomes "Lo", the level of the feedback communication line 542 does not become "Lo" unless the level of the feedback communication line 542 is made "Lo" by the drive IC part 522A related to the switching element Q22 of the upper arm. Thus, the feedback signal (i.e., the first element information) from the feedback communication line 542 can be transmitted to the microcomputer 510 without being influenced by the feedback signal (i.e., the second element information) from the feedback communication line 540.

Figures 9, 10:
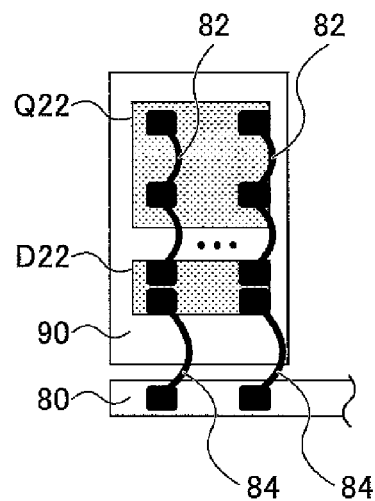
FIG. 9 is a diagram explaining an example illustrated in FIG. 8, and a table illustrating a manner in which first element information and second element information are changed according to a drive IC that detects an overcurrent.
FIG. 10 is a diagram illustrating an example of an installation for switching elements Q22, Q23 and diodes D22, D24 of a DC/DC converter 20.

FIG. 9 is a diagram explaining the example illustrated in FIG. 8, and a table illustrating a manner in which first element information and second element information is changed according to a case where a drive IC that detects an overcurrent is one of the drive IC parts 522 and a case where a drive IC that detects an overcurrent is drive IC part 522A. In FIG. 9, a circle mark indicates a state in which the feedback signal is received by the microcomputer 510.

When only the drive IC part 522A related to the switching element Q22 of the upper arm detects the short circuit failure, the feedback signal from the drive IC part 522A related to the switching element Q22 of the upper arm is received by the microcomputer 510 via the feedback communication line 542 and the feedback communication line 540. Thus, as illustrated in FIG. 9, the first element information and the second element information are received by the microcomputer 510. On the other hand, if other drive IC parts 522 detect the short circuit failure, the feedback signals from the drive IC parts 522 are received by the microcomputer 510 via only the feedback communication line 540. Thus, as illustrated in FIG. 9, only the second element information is received by the microcomputer 510.

In this way, in the example illustrated in FIG. 8, the microcomputer 510 can detect the short circuit failure of the switching element Q24 of the lower arm based on the state (i.e., the first information) of the feedback communication line 542. For example, when the short circuit failure of the switching element Q24 of the lower arm occurs, the drive IC part 522A detects, based on the abnormality in the current value of the current sensor (i.e., the sense emitter), the short circuit failure of the switching element Q24 of the lower arm. Then, the drive IC part 522A generates the feedback signal according to the short circuit failure, and transmits the feedback signal to the microcomputer 510 via the feedback communication line 542. Therefore, the microcomputer 510 can detect the short circuit failure of the switching element Q24 of the lower arm.

Next, an example of a way of installing the switching element Q22 and the diode D22 of the DC/DC converter 20 is explained. It is noted that, in the following, the way of installing the switching element Q22 and the diode D22 of the DC/DC converter 20 is described; however, a way of installing the switching element Q24 and the diode D24 may be the same.

FIG. 10 is a diagram schematically illustrating an example of the way of installing the switching element Q22 and the diode D22 of the DC/DC converter 20, and schematically illustrating an installed state on a substrate 90.

The switching element Q22 and the diode D22 are installed as a chip on the substrate 90. For example, the switching element Q22 and the diode D22 may be soldered to the substrate 90. The substrate 90 may be a heat spreader (a copper block, for example), or a DBA (Direct Brazed Aluminum) substrate that includes copper plates or aluminum plates on opposite sides of a ceramic substrate.

The switching element Q22 and the diode D22 are connected to each other by a first conducting line 82. In the example illustrated in FIG. 10, the switching element Q22 is an IGBT, and the first conducting line 82 connects an emitter electrode of the switching element Q22 and an anode electrode of the diode D22. The first conducting line 82 may be in the form of a tape or a wire, for example. In this case, there are a plurality of the first conducting lines 82 (five first conducting lines, for example) provided in parallel, as illustrated in FIG. 10. Alternatively, the first conducting line 82 may be in a form of a metal plate such as a bus bar 80. It is noted that a black rectangular mark in FIG. 10 (also in FIG. 11 and FIG. 12) represents a bonded portion (welded with ultrasonic welding or laser welding) of the first conducting line 82.

The diode D22 is connected to the bus bar 80 via a second conducting line 84. The bus bar 80 is connected to the reactor L1. In the example illustrated in FIG. 10, the second conducting line 84 connects the anode of the diode D22 to the bus bar 80. The second conducting line 84 may be in form of a tape or a wire, for example. In this case, there are a plurality of the second conducting lines 84 (five second conducting lines, for example) provided in parallel, as illustrated in FIG. 10. Alternatively, the second conducting line 84 may be in a form of a metal plate such as the bus bar 80. It is noted that a black rectangular mark in FIG. 10 (also in FIG. 11 and FIG. 12) represents a bonded portion (welded with ultrasonic welding or laser welding) of the second conducting line 84.

It is noted that the switching element Q22 and the diode D22 are connected to the positive electrode line (i.e., the positive electrode side of the smoothing capacitor C2) of the inverter 30 via another bus bar (not illustrated). In the example illustrated in FIG. 10, the switching element Q22 is an IGBT, a collector electrode of the switching element Q22 and a cathode electrode of the diode D22 are connected to another bus bar via the substrate 90 to be connected to the positive electrode line of the inverter 30.

Figure 11:
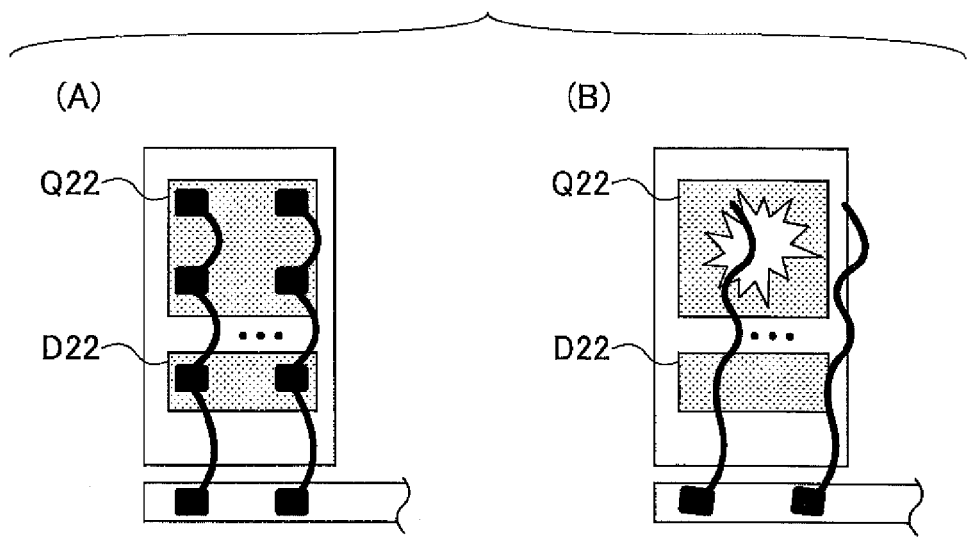
FIG. 11 is a diagram illustrating an installation according to a comparative example.

FIG. 11 is a diagram illustrating an installation according to a comparative example. According to the comparative example, as illustrated in FIG. 11 (A), the switching element Q22 and the diode D22 are connected to the bus bar via a common conducting line. In other words, a certain conducting line (a tape or wire) connects the emitter electrode of the switching element Q22, the anode of the diode D22 and the bus bar.

Here, there may be a case where the neighboring arm is broken together with the failed arm due to the surge generated in the failed arm at the time of the short circuit failure. For example, there may be a case where the switching element Q22 of the upper arm is broken due to the surge generated in the lower arm at the time of the short circuit failure of the switching element Q24 of the lower arm.

According to the comparative example, as schematically illustrated in FIG. 11 (B), when the switching element Q22 is broken, there may be a case where the wiring (a tape or wire) is blown off from the diode D22 due to the impact at the breakage. In this case, a current path of the upper arm is disconnected, which disables supplying the electrical power to the vehicle travel motor 40.

In contrast, according to the example illustrated in FIG. 10, the second conducting line 84 is formed separately (independently) from the first conducting line 82. Thus, although the bonded portion of the first conducting line 82 may be blown off due to the impact at the breakage of the switching element Q22, the second conducting line 84 can survive. In other words, the current path of the upper arm is not disconnected, which enables keeping a state in which the electrical power can be supplied to the vehicle travel motor 40.

In this way, according to the example illustrated in FIG. 10, the second conducting line 84 and the first conducting line 82 are formed separately, which enables supplying the electrical power to the vehicle travel motor 40 via the second conducting line 84 (and the diode D22) even if the switching element Q22 is broken together at the time of the short circuit failure of the switching element Q24 of the lower arm. Therefore, the emergency travel can be implemented with the vehicle travel motor 40.

Figure 12:
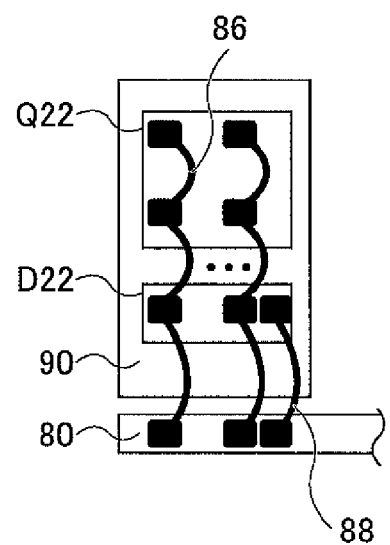
FIG. 12 is a diagram illustrating an example of a way of installing the switching element Q22 and the diode D22 of the DC/DC converter 20.

FIG. 12 is a diagram schematically illustrating another example of the way of installing the switching element Q22 and the diode D22 of the DC/DC converter 20, and schematically illustrating an installed state on the substrate 90.

In the example illustrated in FIG. 12, a first conducting line 86 connects the emitter electrode of the switching element Q22 and the anode electrode of the diode D22, and the anode electrode of the diode D22 and the bus bar 80, as is the case with the comparative example illustrated in FIG. 11. However, in the example illustrated in FIG. 12, unlike the comparative example illustrated in FIG. 11, a second conducting line 88 is included. The second conducting line 88 is formed separately from the first conducting line 86 to connect the anode electrode of the diode D22 and the bus bar 80.

According to the example illustrated in FIG. 12, as is the case with the example illustrated in FIG. 10, the second conducting line 88 and the first conducting line 86 are formed separately, which enables supplying the electrical power to the vehicle travel motor 40 via the second conducting line 88 (and the diode D22) even if the switching element Q22 is broken together at the time of the short circuit failure of the switching element Q24 of the lower arm. Therefore, the emergency travel can be implemented with the vehicle travel motor 40.

Figure 13:
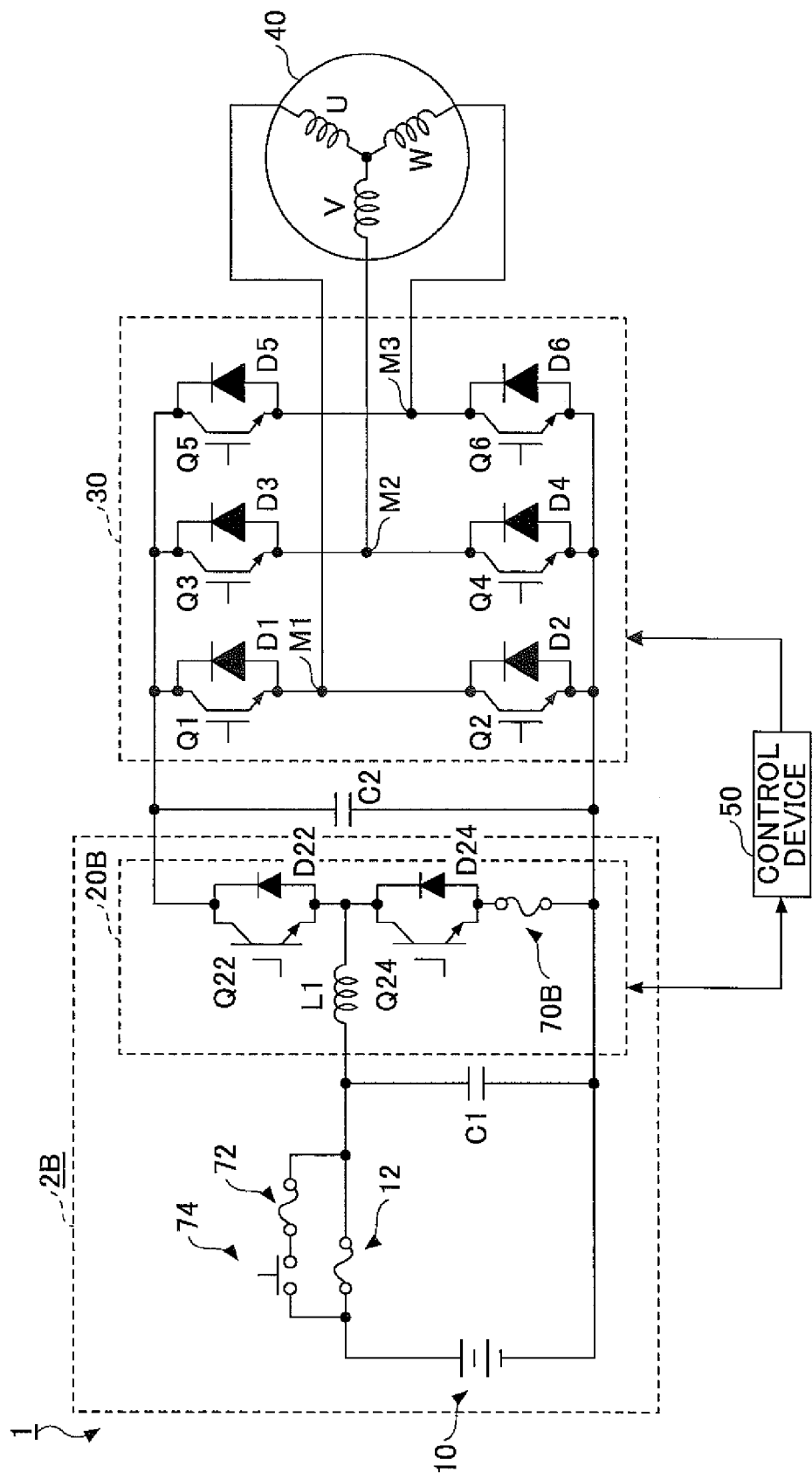
FIG. 13 is a diagram illustrating a configuration of a power supply apparatus 2B according to another embodiment.

FIG. 13 is a diagram illustrating a configuration of a power supply apparatus 2B according to another embodiment. The power supply apparatus 2B according to the embodiment differs from the embodiment described above in a configuration of a DC/DC converter 20B. Specifically, the power supply apparatus 2B according to the embodiment differs from the embodiment described above in that the lower arm relay 70 is replaced with a fuse 70B (referred to as "a lower arm relay 70B", hereinafter), and other elements may be the same.

The lower arm relay 70B includes a fusing characteristic such that the lower arm relay 70B is fused earlier than the power supply fuse 12 at the time of the short circuit failure of the switching element Q24 of the lower arm. In this case, the lower arm relay 70B is fused prior to fusing of the power supply fuse 12 at the time of the short circuit failure of the switching element Q24 of the lower arm. With this arrangement, the short circuit state of the lower arm can be cleared, and thus the overcurrent from the battery 10 is prevented, which can protect the battery 10. It is noted that at the time of the short circuit failure of the switching element Q24 of the lower arm the electrical charges accumulated in the capacitors such as the smoothing capacitor C2, etc., have been discharged, and thus the current from the battery 10 for charging capacitors becomes relatively great after the fusing of the lower arm relay 70B (the current from the battery 10 also becomes relatively great at the time of the ignition ON event). The power supply fuse 12 may be fused due to the current; however, even if such a fusing of the power supply fuse 12 occurs, the electrical power can be supplied to the vehicle travel motor 40 from the battery 10 via the second power supply fuse 72 and the second fuse relay 74 by closing the second fuse relay 74, as is the case with the embodiment described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, in the embodiments described above, the lower arm relay 70 and the second fuse relay 74 are not necessarily mechanical switches, and thus may be replaced with other switches (semiconductor switching elements, for example).

Further, according to the embodiments described above, the control device 50 controls the DC/DC converter 20, the lower arm relay 70 and the second fuse relay 74; however, the control device 50 may control only the lower arm relay 70 and the second fuse relay 74. Further, a part of or all of the function of controlling the lower arm relay 70 and the second fuse relay 74 may be implemented by another control device different from the control device 50.

Further, in the embodiments described above, the feedback signal generates various items of the information with the patterns of "Hi" level and "Lo" level; however, the patterns of "Hi" level and "Lo" level are arbitrary. Further, the feedback signal may be in the form of a digital signal or an analog signal. Further, according to the embodiments described above, the feedback signal includes the abnormality status information; however, the feedback signal may transmit only the information of the short circuit failure. In this case, the microcomputer 510 can determine the presence or absence of the short circuit failure based on only the presence or absence of the reception of the feedback signal.

Further, according to the embodiments described above, the switching elements Q22, Q24 and the diodes D22, D24 form the upper and lower arms such that one pair is formed for each arm; however, the switching elements Q22, Q24 and the diodes D22, D24 may form two or more pairs of the upper and lower arms. The DC/DC converter 20 may include the upper and lower arms that include two or more phases, instead of a single phase.

Further, according to the embodiments described above, the electrical load is the vehicle travel motor 40; however, the electrical load may be another motor or a load other than the motor.

DESCRIPTION OF REFERENCE SYMBOLS 1 motor drive system
2 power supply apparatus
10 battery
12 power supply fuse
20 DC/DC converter
30 inverter
40 vehicle travel motor
50 control device
70 lower arm relay
72 second power supply fuse
74 second fuse relay
80 bus bar
82, 86 first conducting line
84, 88 second conducting line
510 microcomputer
522 (522A) drive IC part
530 gate signal communication line
540, 542 feedback communication line

The invention claimed is:

1. A power supply apparatus, comprising:
a power supply;
a DC/DC converter that includes a switching element of an upper arm, a switching element of a lower arm and a reactor, the switching element of the upper arm and the switching element of the lower arm being connected in series between a positive electrode and a negative electrode of the power supply, one end of the reactor being connected between the switching element of the upper arm and the switching element of the lower arm, the other end of the reactor being connected the power supply;
a first switch that is provided between the switching element of the lower arm and the negative electrode of the power supply, the first switch being normally closed;
a power supply fuse that is provided between the positive electrode of the power supply and the other end of the reactor;
a second power supply fuse that is connected to the power supply fuse in parallel;
a second switch that is connected to the second power supply fuse in series and connected to the power supply fuse in parallel, the second switch being normally opened; and
a controller that opens the first switch and closes the second switch upon a short circuit failure of the switching element of the lower arm being detected.

2. The power supply apparatus of claim 1, wherein the controller opens the first switch and closes the second switch upon a short circuit failure of the switching element of the lower arm being detected and a fusing of the power supply fuse being detected.

3. The power supply apparatus of claim 1, wherein the controller opens the first switch and closes the second switch, and further forms an ON state of the switching element of the upper arm.

4. The power supply apparatus of claim 1, wherein the controller detects the short circuit failure of the switching element of the lower arm based on a current value through the switching element of the upper arm, the current value being obtained upon the switching element of the upper arm being turned on.

5. The power supply apparatus of claim 2, further comprising:
a filter capacitor that is connected between the positive electrode and the negative electrode of the power supply, one end of the filter capacitor being connected between the reactor and the power supply fuse, wherein
the controller detects the fusing of the power supply fuse based on a decrease in a voltage across the filter capacitor.

6. The power supply apparatus of claim 1, further comprising:
an upper arm drive circuit that drives the switching element of the upper arm according to a drive signal from the controller;
a lower arm drive circuit that drives the switching element of the lower arm according to a drive signal from the controller; and
communication lines that are provided between the upper arm drive circuit and the controller, and between the lower arm drive circuit and the controller, the communication lines being provided for transmitting abnormality information from the upper arm drive circuit and the lower arm drive circuit, wherein
the controller detects the short circuit failure of the switching element of the lower arm upon the abnormality information representing an overcurrent state being received from the upper arm drive circuit.

7. The power supply apparatus of claim 6, wherein
the communication lines include a first communication line and a second communication line, the first communication line being connected between a point of a predetermined power supply voltage and the controller, the second communication line being connected to the point of the predetermined power supply voltage via the first communication line and connected to the controller, a level of a signal of the first communication line being switched between "Hi" level and "Lo" level by the upper arm driver circuit, a level of a signal of the second communication line being switched between "Hi" level and "Lo" level by the lower arm driver circuit,
the abnormality information representing the overcurrent state is generated with a predetermined pattern of "Hi" level and "Lo" level, and
the controller detects the short circuit failure of the switching element of the lower arm upon the abnormality information representing the overcurrent state being received via the first communication line, among the first and second communication lines.

8. The power supply apparatus of claim 1, further comprising:
- a diode of the upper arm that is connected to the switching element of the upper arm in parallel;
- a first conducting line that connects a predetermined electrode of the switching element of the upper arm and a predetermined electrode of the diode of the upper arm; and
- a second conducting line that connects a predetermined electrode of the diode of the upper arm and the other end of the reactor, the second conducting line being separated from the first conducting line.

9. A power supply apparatus, comprising:
- a power supply;
- a DC/DC converter that includes a switching element of an upper arm, a switching element of a lower arm and a reactor, the switching element of the upper arm and the switching element of the lower arm being connected in series between a positive electrode and a negative electrode of the power supply, one end of the reactor being connected between the switching element of the upper arm and the switching element of the lower arm, other end of the reactor being connected the power supply;
- a lower arm fuse that is provided between the switching element of the lower arm and the negative electrode of the power supply;
- a power supply fuse that is provided between the positive electrode of the power supply and the other end of the reactor;
- a second power supply fuse that is connected to the power supply fuse in parallel;
- a second switch that is connected to the second power supply fuse in series and connected to the power supply in parallel, the second switch being normally opened; and
- a controller that closes the second switch upon a short circuit failure of the switching element of the lower arm being detected, wherein
- the lower arm fuse has a fusing characteristic such that the lower arm fuse is fused earlier than the power supply fuse at a time of the short circuit failure of the switching element of the lower arm.

* * * * *